United States Patent [19]

Tigges

[11] Patent Number: 5,548,094
[45] Date of Patent: Aug. 20, 1996

[54] MOUNTING BASE FOR AN INDUCTIVE PROXIMITY SWITCH

[75] Inventor: Burkhard Tigges, Balve, Germany

[73] Assignee: Werner Turck GmbH & Co. KG, Halver, Germany

[21] Appl. No.: 231,915

[22] Filed: Apr. 25, 1994

[30] Foreign Application Priority Data

Jul. 7, 1993 [DE] Germany .................. 93 10 119.8

[51] Int. Cl.⁶ .................................................. G01P 3/49
[52] U.S. Cl. ............... 200/303; 200/305; 307/91; 324/207.12; 361/180
[58] Field of Search .................. 200/305, 308; 361/180, 179; 324/207.12, 207.15, 207.16, 207.23–207.26, 225, 234; 307/91, 116, 104; 336/65, 73, 75, 90

[56] References Cited

U.S. PATENT DOCUMENTS

| | | | |
|---|---|---|---|
| 4,090,091 | 5/1978 | Brown et al. | 361/179 X |
| 4,225,748 | 9/1980 | Buck et al. | 361/179 X |
| 5,150,049 | 9/1992 | Schuetz | 324/207.12 |
| 5,196,792 | 3/1993 | Lafaye | 361/180 X |
| 5,373,234 | 12/1994 | Kulczyk | 324/207.12 X |

FOREIGN PATENT DOCUMENTS 0036750  3/1980  Japan .................. 324/207.12

*Primary Examiner*—Renee S. Luebke
*Attorney, Agent, or Firm*—Antonelli, Terry, Stout & Kraus

[57] ABSTRACT

A mounting base for an associated inductive proximity switch, with the mounting base having an approximately beaker-shaped plastic housing so constructed that the switching behavior of the proximity switch is independent of the respective mounting surfaces. A metal ring is disposed internally on a base bottom of the mounting base, with a diameter of the ring being approximately equal to transverse dimensions of the proximity switch. The metal ring is advantageously located in a corner area of the base bottom and a jacket surface of the mounting base.

18 Claims, 3 Drawing Sheets

MOUNTING BASE FOR AN INDUCTIVE PROXIMITY SWITCH

BACKGROUND OF THE INVENTION

1. Field of the Invention

The present invention relates to a mounting base for an associated inductive proximity switch with the mounting base being in the form of a substantially beaker-shaped plastic housing.

2. Description of the Prior Art

Proximity switches are used, for example, in robot control in manufacturing facilities, with a high response accuracy being required. A number of proximity switches have been proposed which meet this requirement.

In, for example, DE-PS 40 31 252 a proximity switch with accurate switching behavior is proposed using a proximity switch operating with a differential coil method, in which a response distance remains exactly constant even with temperature fluctuations. However, it has been found that the switching behavior of such proximity switches can change when they are mounted on metal surfaces, depending on their electrical conductivity or the thickness of their paint. Even if these changes are relatively minor, these changes can cause problems in precision controls.

SUMMARY OF THE INVENTION

The present invention provides a proximity switch having a switching behavior independent of the mounting surface.

In accordance with the present invention, a proximity switch is provided with a mounting base having a metal ring disposed internally on a bottom of the mounting base, with a diameter of the metal ring being substantially equal to transverse dimensions of the proximity switch. Such a metal ring, functioning as a short-circuiting ring, screens the proximity switch from interacting with the mounting surface. The interaction between the metal ring and the proximity switch is constant and can thus be taken into account by the manufacturer when designing the proximity switch. At the installation site, the proximity switch exhibits a constant switching behavior that is independent of the respective mounting surface.

The metal ring, according to additional features of the present invention, is advantageously located in a corner area between the bottom of the mounting base and a jacket surface of the mounting base, with the metal ring occupying only a small amount of space. Therefore, it is also possible to provide electrical terminals on the bottom of the mounting base for associated plug-in contacts of the proximity switch so that the proximity switch can be easily mounted on the mounting base and also quickly replaced if necessary.

Advantageously, in accordance with the present invention the metal ring is fashioned as a closed metal ring preferably made of copper or another metal of high conductivity. The metal ring is fashioned as a metal wire having a diameter of approximately 1 mm. Attached terminals for matching plug-in connection or contacts of the proximity switch are located on a bottom surface of the mounting base.

The proximity switch includes a cap-shaped plastic housing for insertion approximately halfway into the beaker-shaped mounting base.

BRIEF DESCRIPTION OF THE DRAWINGS

The invention will now be described in greater detail with reference to an embodiment shown in the drawings wherein.

DETAILED DESCRIPTION OF THE PREFERRED EMBODIMENTS

Figure 1:
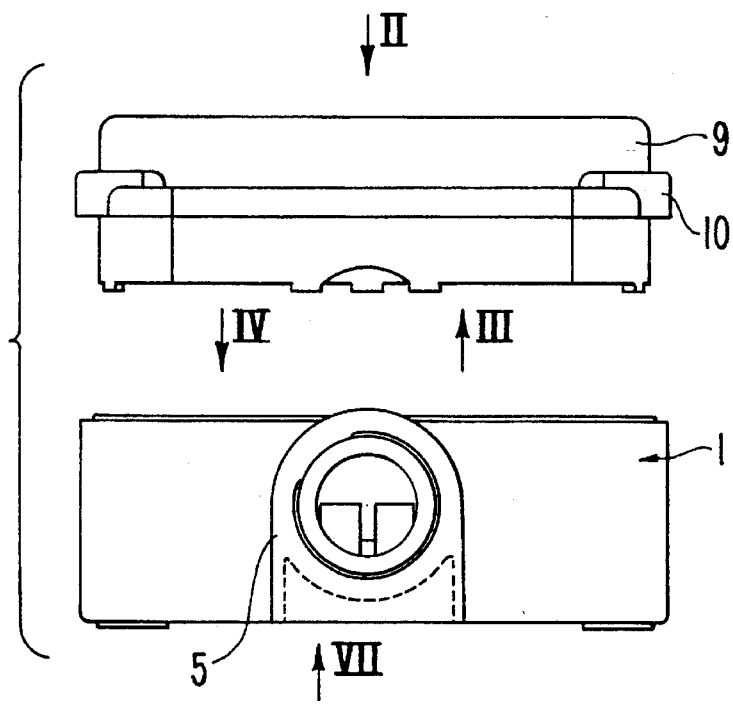
FIG. 1 is an exposed side view of a mounting base with an associated proximity switch.
Figure 2:
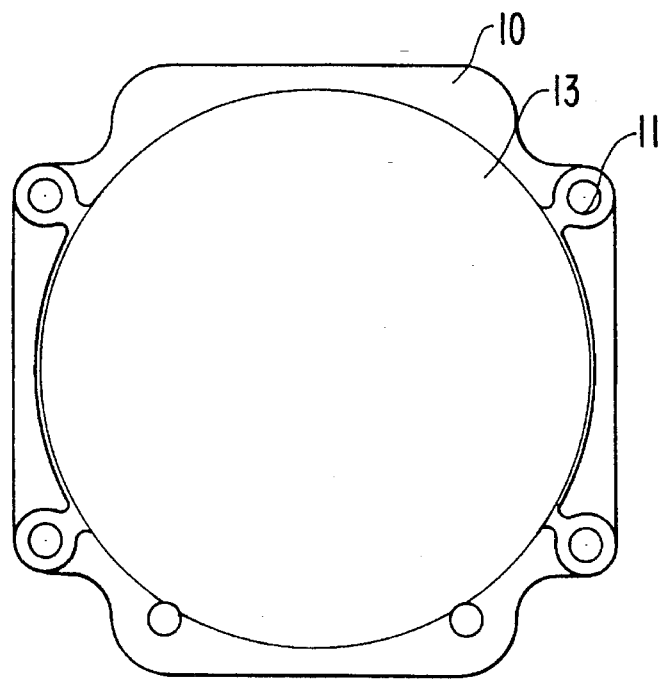
FIG. 2 is a top view of the proximity switch, in a direction of the arrow II in FIG. 1.
Figure 3:
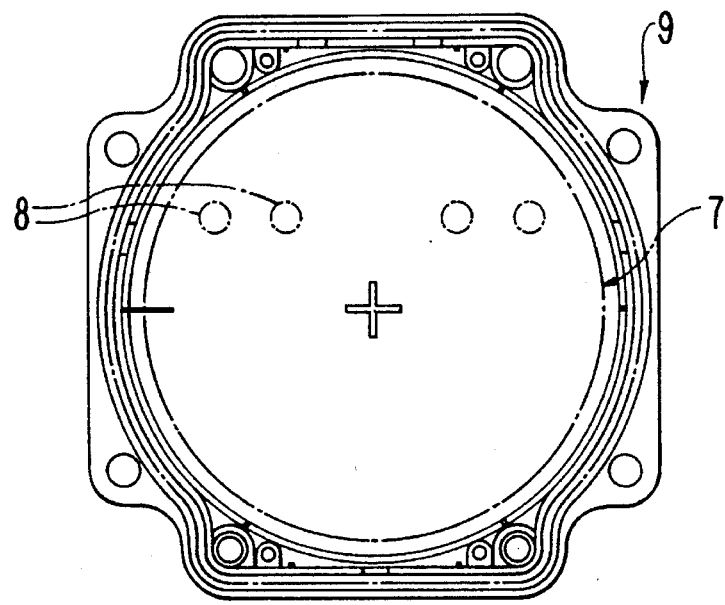
FIG. 3 is a bottom view of the proximity switch in a direction of the arrow III in FIG. 3.
Figure 4:
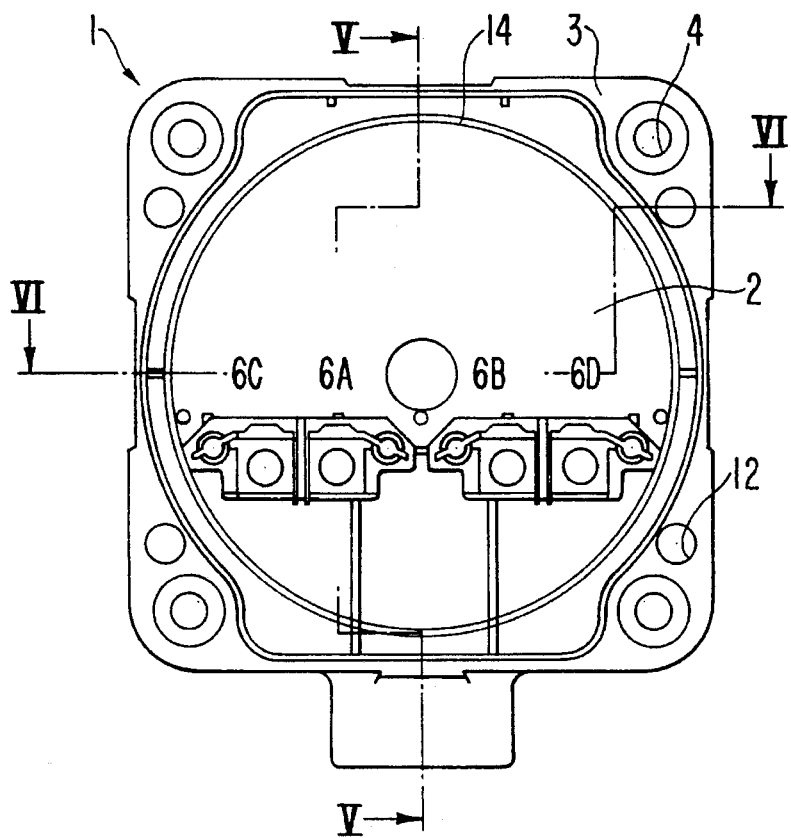
FIG. 4 is a top view of the mounting base, in a direction of the arrow IV in FIG. 1.
Figure 5:
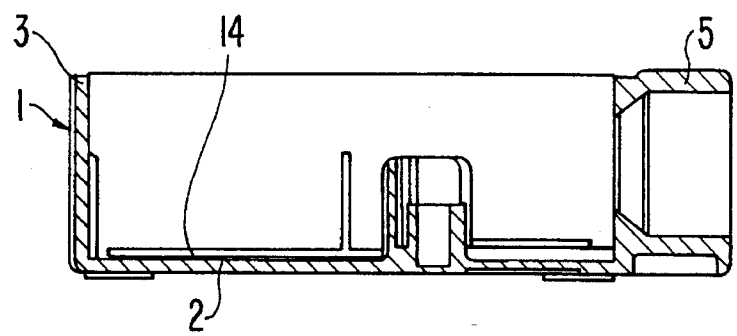
FIG. 5 is a cross-sectional view taken along line V—V in FIG. 4.
Figure 7:
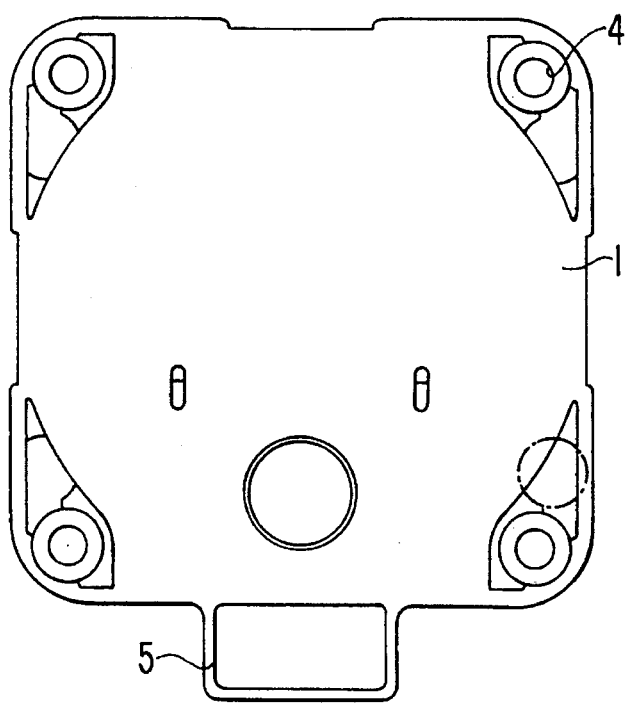
FIG. 7 is a bottom view of the mounting base, in a direction of a arrow VII in FIG. 1.

As shown in the drawings, a mounting base 1 comprises an approximately beaker-shaped plastic housing with a base bottom 2 and a surrounding base jacket 3, having mounting holes 4 at its corners, as shown most clearly in FIG. 4, for enabling a threadable connection to a mounting surface (not shown). The base jacket 3 is provided with a connecting stub (FIGS. 5 and 7) for inserting a cable. Four terminals 6 are disposed on the base bottom 2. The electronic proximity switch 7 itself, indicated by the dot-dashed lines in FIG. 3 and provided with four pin-shaped plug-in contacts 8 aligned with terminals 6A, 6B, 6C and 6D (FIG. 4), is mounted in the upper part of a cap-shaped cylindrical plastic housing (FIG. 1,3) provided at midheight with a surrounding outer flange 10 (FIG. 1). Housing 1, 9 can be fitted by its lower half into the interior of the beaker-shaped mounting base 1, with its outer flange 10 resting on the edge of base jacket 3. A plurality of screw holes 11 (FIG. 2) are provided on flange 10, with which the screw holes 12 on mounting base 1 are aligned. The response surface of the proximity switch in the embodiment shown is located on the top 13 (FIG. 2) of plastic housing 9.

Figure 6:
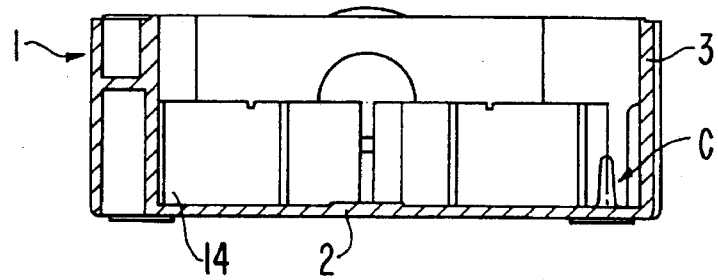
FIG. 6 is a cross-sectional view taken along the line of VI—VI in FIG. 4.

According to the invention, a closed metal ring 14 (FIGS. 4,6), approximately 1 mm thick, is located inside and on the bottom 2 of mounting base 1, with the ring 14 being located in the corner area C of the base bottom 2 and the base jacket 3 and having a diameter substantially equal to a diameter of the proximity switch, The metal ring 14 is made of a metal preferably copper with a high electrical conductivity. The metal ring 14 shields proximity switch 7 from metallic surfaces, so that the proximity switch 7 retains its switching behavior, once set, independently of the mounting surface.

I claim:

1. A mounting base for an associated inductive proximity switch comprising:

an approximately beaker-shaped plastic housing and a metal ring disposed internally at a base bottom of a mounting base with the ring having a diameter approximately equal to transverse dimensions of the inductive proximity switch.

2. A mounting base for an associated inductive proximity switch comprising:

an approximately beaker-shaped plastic housing and a metal ring disposed internally at a base bottom of a mounting base with the ring having a diameter approximately equal to transverse dimensions of the inductive proximity switch and being located in a corner area of the base bottom and a base jacket area of the mounting base.

3. A mounting base according to one of claims 1 or 2 wherein:

electrical terminals for receiving plug-in contacts of the proximity switch are located on the base bottom.

4. A mounting base according to one of claims 1 or 2 further comprising:

a plastic housing inserted into a middle of the mounting base.

5. A mounting base according to one of claims 1 or 2 wherein:

the metal ring is a closed wire ring.

6. A mounting base according to claim 5 wherein:

the metal ring is copper.

7. A mounting base according to claim 6 wherein:

a diameter of the metal ring wire is approximately 1 mm.

8. A mounting base according to claim 7 wherein:

electrical terminals for receiving plug-in contacts of the proximity switch are located on the base bottom.

9. A mounting base according to claim 8 further comprising:

a plastic housing inserted into a middle of the mounting base.

10. A mounting base for an associated inductive proximity switch comprising:

a plastic housing and a metal ring disposed internally at a base bottom of a mounting base with the ring providing shielding of the inductive proximity switch.

11. A mounting base for an associated inductive proximity switch comprising:

a plastic housing and a metal ring disposed internally on a base bottom of a mounting base with the ring providing shielding of the inductive proximity switch and being located in a corner area of the base bottom and a base jacket area of the mounting base.

12. A mounting base according to one of claims 10 or 11 wherein:

electrical terminals for receiving plug-in contacts of the proximity switch are located on the base bottom.

13. A mounting base according to one of claims 10 or 11 further comprising:

a plastic housing inserted into a middle of the mounting base.

14. A mounting base according to one of claims 10 or 11 wherein:

the metal ring is a closed wire ring.

15. A mounting base according to claim 14 wherein:

the metal ring is copper.

16. A mounting base according to claim 15 wherein:

a diameter of the metal ring wire is approximately 1 mm.

17. A mounting base according to claim 16 wherein:

electrical terminals for receiving plug-in contacts of the proximity switch are located on the base bottom.

18. A mounting base according to claim 11 further comprising:

a plastic housing inserted into a middle of the mounting base.

* * * * *